United States Patent [19]

Tsai

[11] Patent Number: 4,910,168
[45] Date of Patent: Mar. 20, 1990

[54] METHOD TO REDUCE SILICON AREA FOR VIA FORMATION

[75] Inventor: Nan-Hsiung Tsai, Cupertino, Calif.

[73] Assignee: MOS Electronics Corporation, Sunnyvale, Calif.

[21] Appl. No.: 191,305

[22] Filed: May 6, 1988

[51] Int. Cl.⁴ .................. H01L 21/283; H01L 21/314
[52] U.S. Cl. .................................... 437/193; 437/191;
437/195; 437/62; 437/239; 437/229; 148/DIG.
106; 148/DIG. 106
[58] Field of Search .............. 437/192, 187, 191, 195,
437/200, 968, 985, 162, 229, 238, 239, 61, 62,
63, 69, 72, 73; 148/DIG. 122, DIG. 102, DIG.
106

[56] References Cited

U.S. PATENT DOCUMENTS

| 3,967,981 | 7/1976 | Yamazaki et al. | 148/DIG. 122 |
|---|---|---|---|
| 4,280,854 | 7/1981 | Shibata et al. | 437/162 |
| 4,305,200 | 12/1981 | Fu et al. | 437/200 |
| 4,582,563 | 4/1986 | Hazuki et al. | 437/192 |

FOREIGN PATENT DOCUMENTS

| 0038056 | 9/1981 | Japan | 437/968 |
|---|---|---|---|
| 2062959 | 5/1981 | United Kingdom | 437/968 |

OTHER PUBLICATIONS

Wolf, S. et al., Silicon Processing: Process Technology, Lattice Press, California, 1986, pp. 407-408.

Primary Examiner—Brian E. Hearn
Assistant Examiner—T. N. Quach
Attorney, Agent, or Firm—Skjerven, Morrill, MacPherson, Franklin & Friel

[57] ABSTRACT

A method for forming substrate contacts in an integrated circuit structure uses a layer of conductive material, preferably polycrystalline silicon, applied to the surface of the semiconductor structure to make electrical contact with exposed portions of the substrate. The polycrystalline silicon layer is then coated with a nitride layer. A via mask which is opaque over the region where a contact will be formed produces a photoresist stud smaller that the original via mask. The photoresist stud is used to pattern the nitride to remain only over the contact region. Following this, the polycrystalline silicon is oxidized except at the nitride mask, forming a bird's beak beneath edges of the nitride. The resulting contact is smaller than the photolithographic limit of the via mask and thus allows for smaller space allocated for contact regions and smaller total structure.

15 Claims, 5 Drawing Sheets

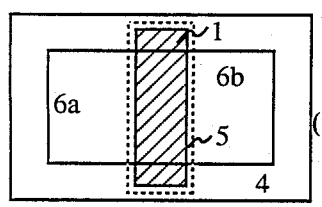 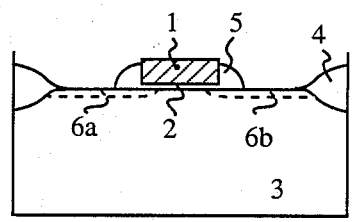
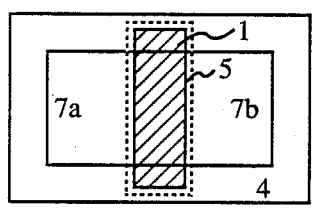 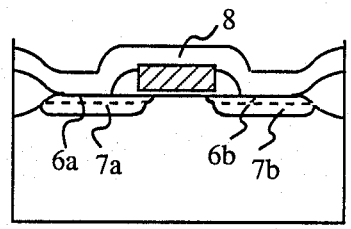
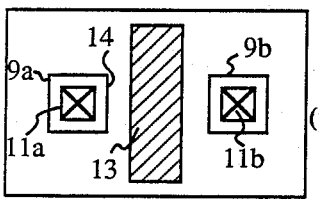 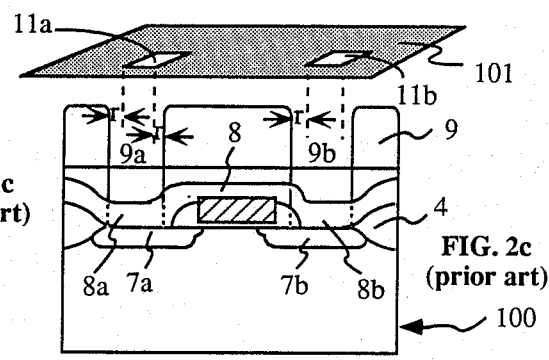
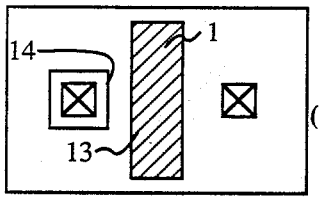 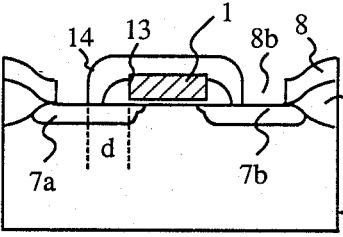
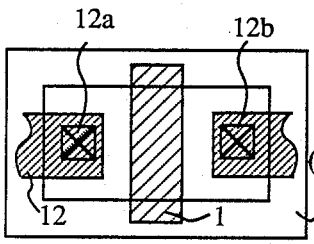 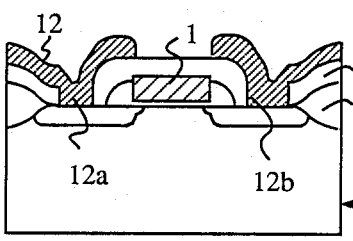
Top View          Cross Section

METHOD TO REDUCE SILICON AREA FOR VIA FORMATION

FIELD OF THE INVENTION

This invention relates to the formation of integrated circuit semiconductor structures, in particular to the process steps for forming vias for connecting conductive lines to a semiconductive substrate.

BACKGROUND

It is desirable in the semiconductor industry to produce structures of as small size as possible in order to lower the total cost and allow the increase of complexity of a product.

One limitation to reducing of integrated circuit die size is the requirement of keeping enough distance between the semiconductive substrate contacts and adjacent conductive structures to prevent shorting of adjacent structures to the contacts due to misalignment between the contacts and the adjacent structures. Misalignment can occur during masking of the contact locations.

Another limitation is the size of the contact opening itself Contact openings through a layer or layers applied to the substrate are typically formed by applying a photoresist layer on the layer or layers and patterning the photoresist layer with a mask having transparent portions located above the desired contact openings. The photoresist is exposed to light at locations beneath these transparent portions in the photolithographic mask. The mask is removed, the photoresist is developed and the developed portions of the photoresist are removed. Scattering of light at the edges of the mask causes exposure of a region of photoresist noticeably larger than the mask transparent regions.

Because the wave length of light used to expose the photoresist is on the same order as the size of transparent regions in the mask, in order to allow light to penetrate through the transparent regions of the mask, the transparent regions must be of a certain minimum size (the photolithographic limit), therefore the photoresist opening must be of a larger size than the photolithographic limit, at minimum.

FIGS. 1a-1e and 2a-2e shown top and side views of a prior art process for forming a semiconductor structure, in this case, MOS transistor structure 100. As shown in FIGS. 1a and 2a, polycrystalline silicon gate 1 has been formed on a thin insulation layer 2 applied to substrate 2. Lightly doped source and drain regions 6a and 6b have been formed using gate 1 and field oxide 4 as self-aligning masks. Subsequently, side-wall spacers 5 have been formed adjacent gate 1. Sidewall spacers 5 can be formed by either chemical vapor deposition of oxide on the wafer surface followed by a blank anisotropic etch to remove oxide on horizontal surfaces, or by thermally growing oxide on the substrate and polysilicon gates, again followed by an anisotropic etch.

Subsequently, as shown in FIGS. 1b and 2b, source/drain regions 7a and 7b are implanted using sidewall spacers 5 and field oxide 4 as masks. Subsequently, a layer of oxide 8 is formed over the surface of the structure. As shown in FIGS. 1c and 2c, photoresist layer 9 is formed on oxide layer 8. Mask 101 is then located above structure 100, with mask transparent regions 11a and 11b positioned above source/drain regions 7a and 7b. Photoresist regions 9a and 9b are then exposed and removed. There is scattering of the exposing light at edges of transparent regions 11a and 11b of mask 101, causing the exposed regions 9a and 9b of photoresist layer 9 to be larger at each side by an amount "r" than transparent regions 11a and 11b of mask 101. Thus when photoresist regions 9a and 9b are removed, the exposed regions 8a and 8b of oxide layer 8 are larger by 2r than transparent mask regions 11a and 11b. Additionally, because mask 101 is not self-aligned with structure 100, allowance must be made for possible misalignment of mask 101. It is essential that conductive material which will extend into openings of oxide layer 8 not contact adjacent gate 1 (or other adjacent structures in other parts of the integrated circuit not shown). Thus a clearance which allows for both sufficient insulation between opening 8a or 8b and gate 1 and for a misalignment tolerance level must be provided. FIG. 3 shows an unacceptable situation in which exposed contact region 8a is misaligned to the point that gate 1 is exposed. In this case, conductive material applied subsequently will contact gate 1, causing a gate 1 to source/drain 7a short, and a failed structure. Clearance d of FIG. 2d is provided to assure both adequate insulation between gate 1 and source/drain regions 7a and 7b and to allow for misalignment. Each via region shown in FIGS. 1e and 2e must be of a size to accommodate tolerance d, enlargement factor 2r, and the size of the transparent regions such as 11a of mask 101. According to one set of design rules, photolithography requirements place the minimum size of mask transparent region 11a at 1.2 microns. The light enlargement r is 0.1 micron on each side for a total enlargement of 0.2 micron, the tolerance for misalignment is 0.3 microns and the side wall insulation thickness is 0.2 micron for a total required allotment of via spacing of 1.9 microns. It is of course desirable to reduce this via spacing.

SUMMARY OF THE INVENTION

According to the present invention, a novel set of processing steps requires allocating a smaller space on the semiconductor surface for locating a contact under the same set of design rules. To the surface of a semiconductor structure having exposed portions of the substrate to which a contact will be formed, is applied a polycrystalline silicon layer, which makes electrical contact with the exposed portions of the substrate. In the case of a MOS, CMOS or BiCMOS semiconductor structure, the following step of heavily doping this polycrystalline silicon layer also causes doping of source/drain regions in portions of the substrate which are covered only by the polycrystalline silicon layer. An oxidation-retarding thin film is then applied, most commonly a thin layer of oxide followed by a layer of silicon nitride.

In BiCMOS structures, this polycrystalline silicon layer can additionally serve to form emitter regions. For example the emitter of an n-p-n bipolar transistor can be formed by n-doping the portion of the polycrystalline silicon layer above an n-well which has a p-doped region formed at the surface where the polycrystalline silicon layer makes contact. Alternatively, it is even possible to form the polycrystalline silicon layer above an n-well not yet having a p-doped region at the surface, and to heavily implant the polycrystalline silicon layer with both p-type boron and n-type arsenic. Because the boron diffuses more readily, the boron will proceed ahead of the arsenic. The polycrystalline silicon layer will retain more arsenic and become an n-type emitter and the boron will move into the substrate to form a p-type region, resulting in an n-p-n bipolar transistor with polycrystalline silicon emitter.

A photolithographic via mask having small opaque areas instead of the prior art small transparent areas takes advantage of the light scattering at the edge of the mask to produce a via region beneath the opaque area which is smaller that the opaque area, rather than larger than the transparent area as was provided in the prior art example above. Then the mask is removed and the photoresist is removed except at the protected locations of the via openings. The exposed nitride layer is then removed. The remaining photoresist is removed, leaving a nitride oxidation retarding mask above the via openings.

In the next novel step, the polycrystalline silicon not protected beneath the nitride and thin oxide regions (which now serve as a mask) is oxidized through its thickness, thereby disconnecting any electrical connection between structures above the substrate surface and source/drain regions in the substrate. This oxidation step forms a bird's beak extending beneath the edges of the nitride oxidation retarding mask. The bird's beak advantageously further decreases the remaining size of the via opening. Thus the required via spacing, instead of being increased by the light spreading from a small photolithographic mask transparency is decreased by both the light spreading and by the bird's beak formation. Contact from a second conductive layer, usually metal or heavily doped polycrystalline silicon, to the source/drain regions takes place through the conductive polycrystalline silicon which remains after the nitride-and-thin-oxide mask is removed.

It is advantageous to the later step of oxidizing the polycrystalline silicon layer that it is heavily doped. The heavily doped polycrystalline silicon oxidizes at a lower temperature in a shorter time.

BRIEF DESCRIPTION OF THE DRAWINGS

FIGS. 1a-1e show top views of the prior art process steps for forming a semiconductive structure, in this case an MOS transistor.

FIGS. 2a-2e show side views of the prior art process steps of FIGS. 1a-1e.

FIGS. 6a and 6b show top and side views of a prior art structure in which misalignment occurs and is provided for.

FIGS. 7a and 7b show top and side views of a structure of the present invention in which misalignment occurs and is provided for.

DETAILED DESCRIPTION OF A PREFERRED EMBODIMENT

Figure 3:
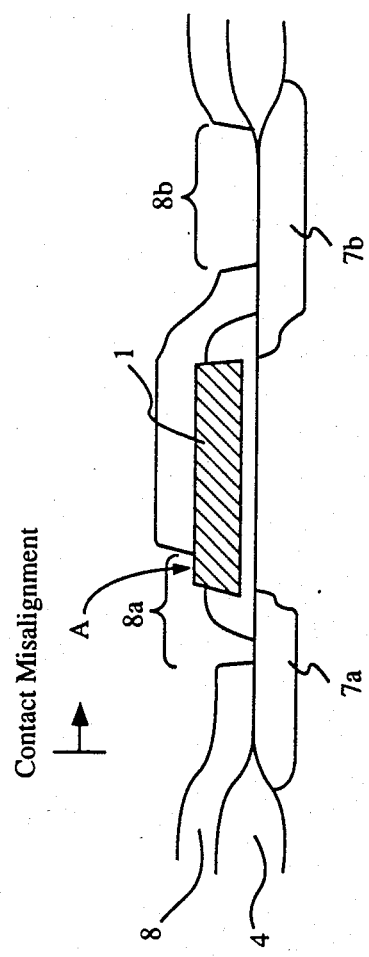
FIG. 3 shows a prior art structure which will fail due to insufficient misalignment allowance.
Figure 4A:
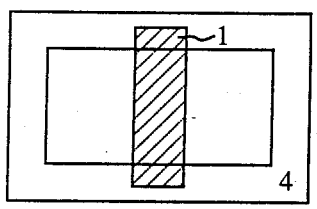
FIGS. 4a-4e show top views of process steps of the current invention for forming a semiconductive structure, in this case an MOS transistor.
Figure 4B:
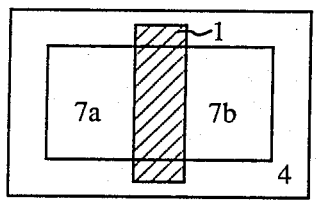
Figure 4C:
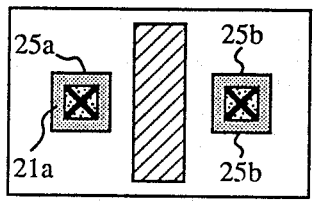
Figure 5A:
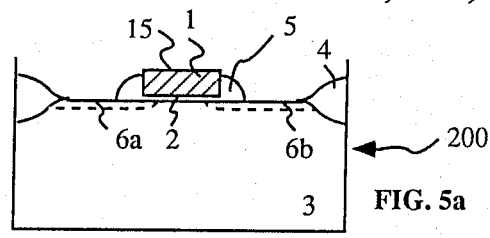
FIGS. 5a-5e show side views of the process steps of FIGS. 4a-4e.

At the point in the process shown in FIGS. 4a and 5a, semiconductor structure 200 is identical to semiconductor structure 100 of FIGS. 1a and 2a. Next, however, polycrystalline silicon layer 17 is applied to the surface of semiconductor structure 200 in good electrical contact with source/drain regions 7a and 7b at the surface of semiconductor substrate 3. In this embodiment, polycrystalline silicon layer 17 is also in electrical contact with top surface 15 of polycrystalline silicon gate 1. Polycrystalline silicon layer 17 is preferably 500–1000Å thick. Polycrystalline silicon layer 17 is doped to have a high conductivity, preferably on the order of 50–200 ohms/square which is achieved with a doping level of $10^{16}$ cm$^{-2}$. To the surface of polycrystalline silicon layer 17 is applied a thin oxide layer 19, about 300Å thick, and to the surface of thin oxide layer 19 is applied nitride layer 20, about 1000Å thick. Polycrystalline silicon layer 17, thin oxide layer 19, and nitride layer 20 are formed by well known processes, for example polycrystalline silicon layer 17 is formed by low pressure chemical vapor deposition (LPCVD) at a temperature of about 620° C., thin oxide layer 19 is formed by thermal oxidation in an oxygen atmosphere at a temperature of 800° –1000° C., and nitride layer 20 is formed by LPCVD at a temperature of about 850° C.

Figure 5B:
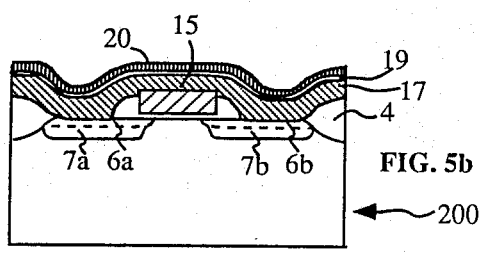

As shown in FIG. 5b, polycrystalline silicon layer 17 provides electrical contact between the top surface 15 of polycrystalline silicon gate 1 and top surfaces of source/drain regions 7a and 7b. Polycrystalline silicon layer 17 is sacrificial in that most of it will later be oxidized, as further described, to become an insulation layer, and in this embodiment will not continue to provide electrical contact to gate 1.

To the surface of nitride layer 20 is applied photoresist layer 21.

Figure 5C:
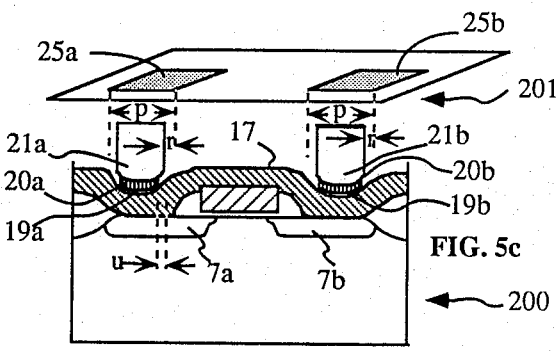

Next, as shown in FIG. 5c, via mask 201 is positioned above the surface of semiconductor structure 200 such that opaque regions 25a and 25b are located above source/drain regions 7a and 7b, respectively. There is a possibility of misalignment in this step. According to the design rules of the present embodiment which are in agreement with the design rules of the embodiment described with respect to FIGS. 1a-1e and 2a-2e, 0.3 micron of horizontal distance per via will be allowed for misalignment, though of course other tolerances are equally possible. Via mask 201 includes opaque regions 25a and 25b. While via mask 201 is in place, photoresist layer 21 is exposed. Via mask 201 is then removed and exposed portions of photoresist layer 21 removed, leaving photoresist studs 21a and 21b. As in the prior art process of FIGS. 1a-1e, the light exposing photoresist layer 21 will deflect at edges of opaque regions 25a and 25b. However, instead of producing larger openings in the photoresist, the present process produces photoresist studs 21a and 21b having a smaller horizontal dimension than mask opaque regions 25a and 25b. For light scattering of an amount r at each edge of masks 25a and 25b, the horizontal dimensions of each of photoresist studs 21a and 21b are less by 2r than the horizontal dimensions of opaque regions 25a and 25b, respectively. This is in contrast to the prior art structure of FIGS. 1c and 2c in which light scattering produced an increase in the horizontal dimensions of removed photoresist regions 9a and 9b.

Using photoresist studs 21a and 21b as masks, exposed portions of nitride layer 20 and thin oxide layer 19 are removed, leaving nitride region 20a, nitride region 20b, thin oxide region 19a, and thin oxide region 19b. This step causes undercutting of photoresist studs 21a and 21b by an amount u at each side of photoresist studs 21a and 21b so that the horizontal dimensions of nitride regions 20a and 20b are less by 2u than the horizontal dimensions of photoresist studs 21a and 21b.

Figure 4D:
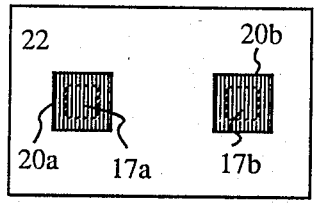
Figure 4E:
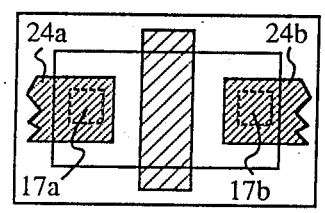
Figure 5D:
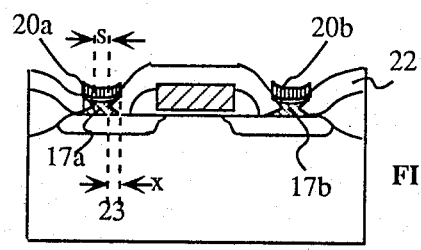
Figure 5E:
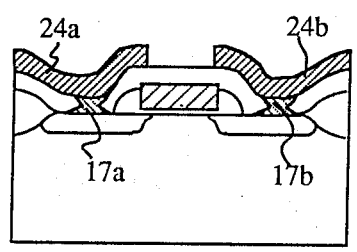

Nitride region 20a, nitride region 20b, thin oxide region 19a, and thin oxide region 19b will now serve as oxidation retarding masks for retaining conductive polycrystalline silicon via contacts adjacent source/drain regions 7a and 7b. Exposed portions of polycrystalline silicon layer 17 are oxidized so that the full depth of polycrystalline silicon layer 17 becomes oxidized except at polycrystalline silicon regions 17a and 17b thereby forming oxidized region 22. A conventional dry or wet thermal oxidation process may be used at a temperature of 800° C.–1000° C. Wet oxidation is preferred for advanced VLSI technology because it requires a shorter time and lower temperature. For a thickness of polycrystalline silicon layer 17 of 1000Å wet oxidation at 900° C. for 2 hours will oxidize the full thickness of the layer. Oxidized region 22 appears in cross-sectional FIG. 5d to be three separate regions but can be seen in FIG. 4d to be a single continuous region. It is well known that this oxidation process forms bird's beak regions extending beneath all edges of nitride regions 20a and 20b. For a thickness of polycrystalline silicon layer 17 of 1000Å, oxidized as described above to become about 2000Å thick, these bird's beaks each have a horizontal dimension x of approximately 0.2 microns. Therefore, polycrystalline silicon regions 17a and 17b have a horizontal dimension s smaller by 2x or 0.4 microns than nitride regions 20a and 20b.

Thus, considerably less surface area must be allocated for the formation of each via than in the prior art example described above. In the case where the photolithographic limit places a minimum horizontal dimension p of opaque regions 25a and 25b at 1.2 microns, where r is 0.1 micron, where u is 0.1 micron, where x, as mentioned above, is 0.2 micron, polycrystalline silicon region 17a can have a horizontal dimension of $$p - 2r - 2u - 2x = 1.2 - 0.2 - 0.2 - 0.4 = 0.4 \text{ micron.}$$

Figure 6A:
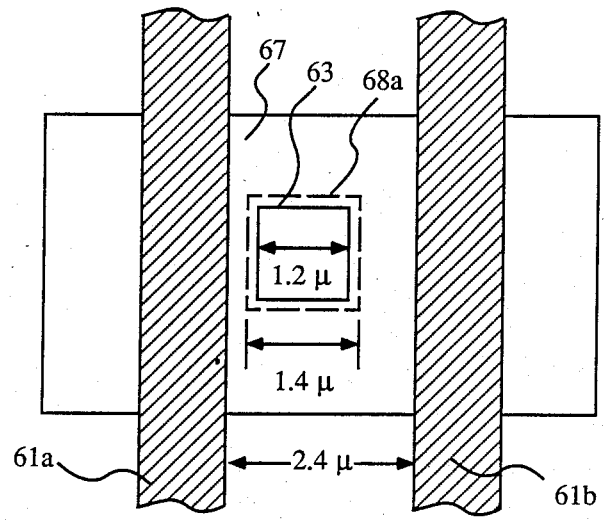
Figure 7A:
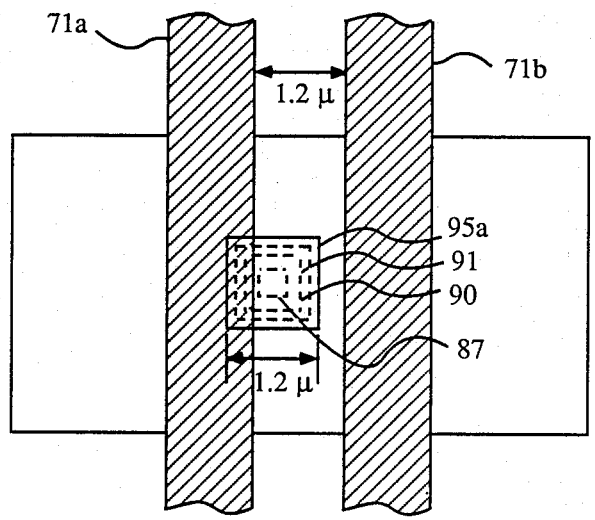
Figure 6B:
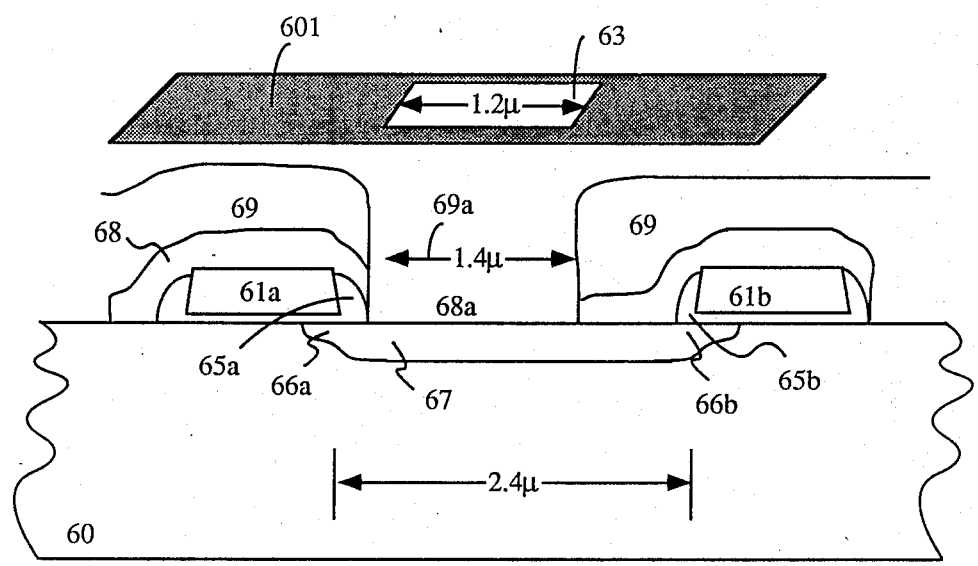
Figure 7B:
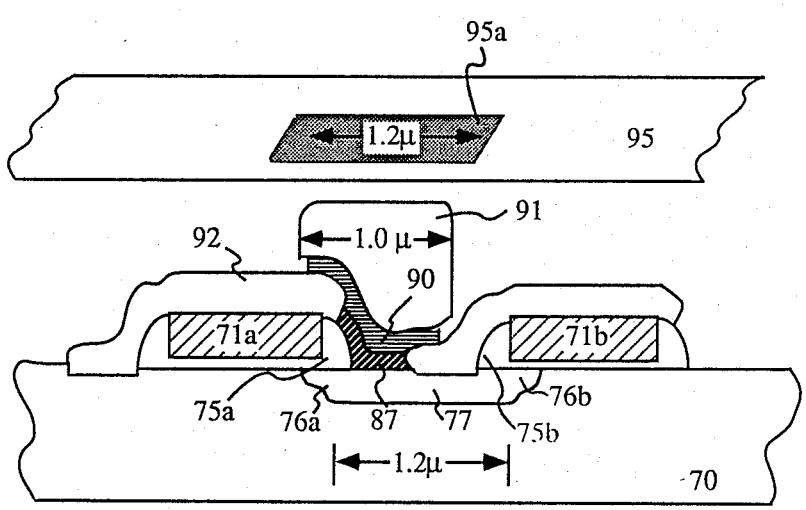

Of course the same alignment tolerance of 0.3 micron as provided in the prior art process of FIGS. 1d and 2d must be provided in the present invention. FIGS. 6a, 6b, show prior art structures and FIGS. 7a, and 7b show present invention structures in which a misalignment of 0.3 micron is provided for and has occurred. The same numerals in different figures refer to the same elements. The layers shown in FIGS. 6b and 7b are not present simultaneously, but are shown here in order to display the relative dimensions of these layers. Top view FIG. 6a and cross sectional view 6b show a structure in which a substrate contact will extend between two gate regions. In order to provide sufficient clearance the separation between gates 61a and 61b in the prior art structure of FIG. 6b is 2.4 microns. The need for this spacing occurs as follows. Transparent region 63 of via mask 601 has a horizontal dimension of 1.2 microns, the same photolithographic limit discussed earlier. Opening 69a in the photoresist and opening 68a in the subsequently etched oxide are 1.4 micron, therefore the final contact horizontal dimension is 1.4 micron. Allowance of 0.3 micron on either side of the contact region for misalignment has been provided. Also, allowance of 0.2 micron on either side of the contact region for side wall insulation has been provided, for a total spacing of 2.4 microns. Because mask 601 is misaligned by 0.3 micron, the minimum 0.2 micron spacing remains for insulation between gate 61a and opening 68a.

For the current invention, shown in FIGS. 7a and 7b, the spacing between gates 71a and 71b need only be 1.2 microns. The need for this smaller spacing is as follows. The photolithographic via mask 95 has an opaque area 95 with a horizontal dimension of 1.2 micron, the same photolithographic limit discussed above. Because the photolithographic mask provides a small opaque area rather than a small transparent area, light refraction causes the unexposed photoresist stud 91 to be 1.0 micron. The undercut oxidation retarding nitride mask 90 has a horizontal dimension of 0.8 micron and the final width of contact 87 after formation of the bird's beaks is 0.4 micron. Allowance of 0.3 micron on either side of this 0.4 micron contact has been provided as above. Additionally, only 0.1 micron is allowed for insulation between gates 71a and 71b and polycrystalline silicon contact 87. This difference is explained below. Thus the total spacing between gates for providing a substrate contact is only 1.2 microns.

The reason for the difference in insulation thickness between the prior art and present structures can be most easily understood by comparing the processes used to produce the structures of FIGS. 6b and 7b. In the structure of FIG. 6b, insulation layer 68 is removed at region 68a by etching while photoresist 69 is in place, having been patterned to remove region 69a. This etch step produces vertical walls. Source/drain regions 66a and 67 were formed earlier using gates 61a and 61b, then sidewall spacers 66a and 66b as masks. As formed, source/drain regions 66a and 67 preferably extend a minimum distance into substrate 60. If part of sidewall spacer 65a were removed during etching, the distance between the contact to be formed at region 68a and the p-n junction between substrate 60 and source/drain region 67 would be too small and a breakdown would develop between substrate 60 and the contact to be formed at region 68a. By contrast, the process for producing the current invention does not remove any of sidewall spacer 75a. Thus adequate space remains between polysilicon contact 87 and substrate 70 when only 0.1 micron is allowed for insulation. The minimum insulation thickness of 0.1 micron, which occurs at the upper corner of gate 71a is sufficient for reliably separating polysilicon region 87 from polysilicon gate 71a.

The above embodiments have been described in detail for one set of dimensions and for one or two MOS transistors. The principles of the present invention which provide an opaque photolithographic mask over a via opening in combination with a conductive layer which is masked with an oxidation retarding film and oxidized to become an insulation layer except at the via openings will of course apply to other embodiments using other materials, other thicknesses, other lateral dimensions and to other semiconductor structures including but not limited to bipolar transistors, CMOS structures, biCMOS structures, resistors, and capacitors. These other embodiments are intended to fall within the scope of the present invention.

The process of the present invention is compatible with the formation of other structures besides substrate contacts. For example, if it is desirable to connect a source/drain region to a gate, a photolithographic mask opaque region may be made large enough to cover both the source/drain region and the adjacent gate so the polycrystalline silicon layer beneath this mask remains conductive after the oxidation step, and therefore provides the electrical connection. Additionally, the same process for forming a contact to a substrate region such as a source/drain region can be used for forming a contact to a gate.

I claim:

1. A method for forming contacts to a semiconductor structure comprising the steps of:

forming and patterning at least one layer of electrically conductive material above the surface of said semiconductor structure, leaving at least one region in said semiconductor structure exposed, and leaving sidewalls of said electrically conductive material exposed;

forming insulation covering said sidewalls of said electrically conductive material in locations adjacent said at least one exposed region;

forming a layer of convertible conductive material on an exposed surface resulting from patterning said at least one layer of electrically conductive material, said layer of convertible conductive material being in contact with said at least one layer of electrically conductive material and in contact with said at least one exposed region in said semiconductor structure, said convertible conductive material having the property of being convertible by a chemical process to an insulating material;

forming on said layer of convertible conductive material a layer of oxidation retarding material which can serve as a mask to prevent converting by said chemical process of said convertible conductive material to said insulating material;

removing said oxidation retarding material except from at last one mask region located above a corresponding one of said at least one exposed region in said semiconductor structure;

converting said convertible conductive material to said insulating material except at said at least one mask region;

removing said oxidation retarding material from said at least one mask region; and applying second conductive material to said semiconductor structure and patterning said second conductive material to contact said convertible conductive material.

2. A method for forming contacts in a semiconductor structure as in claim 1 in which said convertible conductive material comprises polycrystalline silicon.

3. A method for forming contacts in a semiconductor structure as in claim 1 in which said second conductive material comprises metal.

4. A method for forming contacts in a semiconductor structure as in claim 1 in which said second conductive material comprises polycrystalline silicon.

5. A method for forming contacts in a semiconductor structure as in claim 1 in which said oxidation retarding material comprises a thin layer of silicon oxide on which is formed a layer of silicon nitride.

6. A method for forming contacts in a semiconductor structure as in claim 1 in which said at least one structure above the surface of a semiconductor structure comprises two layers from which are formed a polycrystalline silicon gate of an MOS transistor and a field oxide region.

7. A method for forming contacts in a semiconductor structure as in claim 1 in which said at least one exposed region in said semiconductor structure comprises a plurality of exposed regions, at least two of said exposed regions comprising source/drain regions of an MOS transistor.

8. A method for forming contacts in a semiconductor structure as in claim 1 in which said at least one exposed region in said semiconductor structure comprises a plurality of exposed regions, at least one of said exposed regions comprising an emitter region of a bipolar transistor.

9. A method for forming contacts in a semiconductor structure as in claim 1 in which said at least one exposed region in said semiconductor structure comprises a plurality of exposed regions, at least one of said exposed regions comprising a base region of a bipolar transistor.

10. A method for forming contacts in a semiconductor structure as in claim 1 in which said at least one exposed region in said semiconductor structure comprises a plurality of exposed regions, at least one of said exposed regions comprising a collector region of a bipolar transistor.

11. A method for forming contacts in a semiconductor structure as in claim 1 in which said step of removing said oxidation retarding material except from at least one mask region located above a corresponding one of said at least one exposed region comprises:

applying a layer of positive photoresist to said first conductive material;

positioning a photolithographic mask above said semiconductor structure such that at least one opaque area in said photolithographic mask is located above said at least one mask region;

exposing said positive photoresist at regions not covered by said at least one opaque area;

removing said exposed photoresist, thereby leaving at least one photoresist stud above said at least one mask region; and etching said oxidation retarding material at regions not protected by said at least one photoresist stud.

12. A method for forming contacts in a semiconductor structure as in claim 1 including the further step after forming said layer of convertible conductive material, of doping said layer of convertible conductive material with at least one dopant.

13. A method for forming contacts in a semiconductor structure as in claim 12 in which said at least one dopant comprises boron and arsenic and said doping is followed by diffusion of said boron and arsenic into said semiconductor structure.

14. A method for forming contacts in a semiconductor structure as in claim 12 in which said at least one dopant comprises arsenic and said doping is followed by diffusion of said arsenic into said semiconductor structure.

15. A method for forming contacts to a semiconductor structure comprising the steps of:

forming a first layer of insulating material on said semiconductor structure;

forming a first layer of electrically conductive material above the surface of said semiconductor structure;

patterning said first layers of insulating and electrically conductive material to leave at least one exposed region in said semiconductor structure;

forming a second layer of electrically conductive material on an exposed surface comprising exposed portions of said first insulating, first conductive, and exposed region, said second layer of electrically conductive material having the property of being convertible by a chemical process to an insulating material;

forming on said second layer of electrically conductive material a layer of oxidation retarding material which can serve as a mask to prevent converting by said chemical process of said second layer of electrically conductive material to said insulating material;

locating above said oxidation retarding material a patterned photoresist layer, said patterned photoresist layer having at least one stud located above said at least one exposed region in said semiconductor structure;

removing said oxidation retarding material except where covered by said at least one stud, leaving at least one spot of oxidation retarding material smaller than a smallest size opening which can be formed using a photoresist layer having an opening above said at least one exposed region;

converting said second layer of electrically conductive material to said insulating material except beneath said spot;

removing said at least one spot; and applying a third layer of electrically conductive material to an exposed surface of said semiconductor structure, whereby said third layer of electrically conductive material is electrically connected to said exposed region through said second layer of electrically conductive material beneath said spot.

* * * * *